United States Patent
Cheng et al.

(10) Patent No.: US 9,029,947 B2
(45) Date of Patent: May 12, 2015

(54) FIELD DEVICE AND METHOD OF OPERATING HIGH VOLTAGE SEMICONDUCTOR DEVICE APPLIED WITH THE SAME

(71) Applicant: Macronix International Co., Ltd., Hsinchu (TW)

(72) Inventors: An-Li Cheng, Tainan (TW); Miao-Chun Chung, Toufen Township, Miaoli County (TW); Chih-Chia Hsu, Zhongli (TW); Yin-Fu Huang, Tainan (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 14/519,192

(22) Filed: Oct. 21, 2014

(65) Prior Publication Data

US 2015/0035583 A1    Feb. 5, 2015

Related U.S. Application Data

(62) Division of application No. 13/616,522, filed on Sep. 14, 2012, now Pat. No. 8,896,061.

(51) Int. Cl.
*H01L 29/66* (2006.01)
*H01L 21/02* (2006.01)
*H01L 21/336* (2006.01)
*H03K 17/16* (2006.01)
*H01L 29/40* (2006.01)
*H01L 29/78* (2006.01)
*H03K 17/56* (2006.01)
(Continued)

(52) U.S. Cl.
CPC ............. *H03K 17/16* (2013.01); *H01L 29/402* (2013.01); *H01L 29/404* (2013.01); *H01L 29/7816* (2013.01); *H01L 29/0696* (2013.01); *H01L 29/1083* (2013.01); *H01L 29/1087* (2013.01); *H01L 29/1095* (2013.01); *H03K 17/56* (2013.01)

(58) Field of Classification Search
CPC . H01L 27/0248; H01L 29/402; H01L 29/404; H01L 29/7816; H01L 29/1095; H01L 29/1083; H01L 29/1087; H01L 29/0696
USPC .......... 257/341, 484, 486, E29.256, E21.409; 327/382; 438/299
See application file for complete search history.

(56) References Cited

U.S. PATENT DOCUMENTS 5,654,574 A    8/1997   Williams et al.
6,207,484 B1   3/2001   Kim et al.
(Continued)

*Primary Examiner* — Long K Tran
*Assistant Examiner* — Dzung Tran
(74) *Attorney, Agent, or Firm* — McClure, Qualey & Rodack, LLP

(57) ABSTRACT

A field device and method of operating high voltage semiconductor device applied with the same are provided. The field device includes a first well having a second conductive type and second well having a first conductive type both formed in the substrate (having the first conductive type) and extending down from a surface of the substrate, the second well adjacent to one side of the first well and the substrate is at the other side of the first well; a first doping region having the first conductive type and formed in the second well, the first doping region spaced apart from the first well; a conductive line electrically connected to the first doping region and across the first well region; and a conductive body insulatively positioned between the conductive line and the first well, and the conductive body correspondingly across the first well region.

8 Claims, 5 Drawing Sheets

(51) Int. Cl.
*H01L 29/06* (2006.01)
*H01L 29/10* (2006.01)

(56) References Cited

U.S. PATENT DOCUMENTS

| | | |
|---|---|---|
| 2002/0122280 A1* | 9/2002 | Ker et al. ............... 361/56 |
| 2004/0129983 A1 | 7/2004 | Mallikarjunaswamy |
| 2005/0036252 A1 | 2/2005 | Hu et al. |
| 2005/0073007 A1 | 4/2005 | Chen et al. |
| 2006/0006444 A1 | 1/2006 | Leslie |
| 2007/0108602 A1* | 5/2007 | Lee et al. ............... 257/734 |
| 2008/0157197 A1 | 7/2008 | Hsieh et al. |
| 2008/0283914 A1 | 11/2008 | Fuji |
| 2009/0194785 A1* | 8/2009 | Lu et al. ............... 257/139 |
| 2010/0032758 A1* | 2/2010 | Wang et al. ............... 257/343 |
| 2010/0164050 A1 | 7/2010 | Ho et al. |
| 2011/0001196 A1* | 1/2011 | Huang et al. ............... 257/378 |

* cited by examiner

FIELD DEVICE AND METHOD OF OPERATING HIGH VOLTAGE SEMICONDUCTOR DEVICE APPLIED WITH THE SAME

CROSS REFERENCE TO RELATED APPLICATIONS

This application is a Divisional of pending U.S. patent application Ser. No. 13/616,522, filed Sep. 14, 2012 and entitled "FIELD DEVICE AND METHOD OF OPERATING HIGH VOLTAGE SEMICONDUCTOR DEVICE APPLIED WITH THE SAME". The content of which is incorporated herein by reference.

BACKGROUND

1. Field of the Invention

The disclosure relates in general to a field device and method of operating high voltage (HV) semiconductor device applied with the same, and more particularly to a field device which effectively improves turned on threshold voltage (Vth) of parasitic field device of the HV semiconductor device.

2. Description of the Related Art

There is currently an ongoing drive toward the downscaling of device dimensions in virtually all aspects of electronic device manufacture. Smaller electronic devices tend to be more popular than larger, more bulky devices when both devices have substantially equivalent capabilities. For high voltage (HV) or Ultra high voltage (UHV) semiconductor device (such as metal-oxide-semiconductor (MOS) devices), metal lines for connecting devices in silicon processes will induce parasitic field transistor turned on when metal lines pass through specific regions. It means that when MOSFETs is under high voltage operation, maximum operating voltage is limited by turned on threshold voltage (Vth) of parasitic field devices which might be lower than the breakdown voltage of MOSFETs.

Different methods have been proposed to avoid inducing parasitic field transistor from being turned on. For example, pad is formed within a high voltage well to cause no voltage difference between drain and the field device, thereby resulting in no current passing through the field device. However, this method requires largest area for pad and has risks to cause HV-well isolation failure. Another method to avoid inducing parasitic field transistor from being turned on is increasing the thickness of oxide (ILD or IMD) on the HV-well, thereby raising the difficulty for channel reverse of HV-well under HV operation. However, this method requires longer time for growing oxide, which needs extra thermal budget, and the heat accumulation might have considerable effect on other components of the HV semiconductor device.

Accordingly, it would be one of important goals for the manufacturers to improve turned on threshold voltage (Vth) of field device without increasing any cost (e.g. thermal budget or extra mask) and device area (e.g. pad in HVN/HVP WELL), and maintain maximum operating voltage of the HV semiconductor device consequently.

SUMMARY

The disclosure relates to a field device and method of operating high voltage (HV) semiconductor device having the field device. In the present disclosure, the threshold voltage (Vth) of field device is effectively improved without increasing cost and device area, so as to avoid the field device turned on when the HV semiconductor device is under high voltage operation.

According to an aspect of the present disclosure, a field device is provided, comprising a substrate having a first conductive type; a first well having a second conductive type, extending down from a surface of the substrate and formed in the substrate; a second well having the first conductive type, extending down from the surface of the substrate and formed in the substrate, the second well adjacent to one side of the first well and the substrate is at the other side of the first well; a first doping region having the first conductive type and formed in the second well, the first doping region spaced apart from the first well, wherein the doping concentration of the first doping region is larger than that of the second well; a conductive line electrically connected to the first doping region and across the first well region; and a conductive body positioned between the conductive line and the first well, and the conductive body under the conductive line correspondingly across the first well region, wherein the conductive body is insulated from the conductive line.

According to another aspect of the present disclosure, a method of operating high voltage semiconductor device is provided. First, a field device as described above is configured and provided. Then, either no external voltage or a fixed voltage bias is applied to the conductive body of the field device when the HV semiconductor device is operated at a high voltage.

The disclosure will become apparent from the following detailed description of the preferred but non-limiting embodiments. The following description is made with reference to the accompanying drawings.

DETAILED DESCRIPTION

In the embodiments of the present disclosure, field devices, high voltage (HV) semiconductor devices and methods of operating HV semiconductor devices applied with the same are provided, which the threshold voltage (Vth) of field device can be effectively improved without increasing any cost (e.g. thermal budget or extra mask) and device area.

There are several embodiments disclosed below, with reference to the accompanying drawings, are for elaborating the possible structures of field devices of HV semiconductor devices of the disclosure, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Also, the descriptions disclosed in the embodiments of the disclosure such as detailed structure, manufacturing procedures and material selections are for illustration only, not for limiting the scope of protection of the disclosure. In the present embodiments of the disclosure, high voltage metal-oxide semiconductor (HVMOS) and field device thereof are illustrated but not for limitation. In the present embodiments, at least a conductive body positioned between a HV-well of the field device and a conductive line across the HV-well is disclosed. When the HV semiconductor device is operated under high voltage, the voltage difference between the conductive line and the HV-well of the field device could be distributed on the conductive body, thereby effectively improving the threshold voltage (Vth) of the field device.

First Embodiment

Figure 1A:
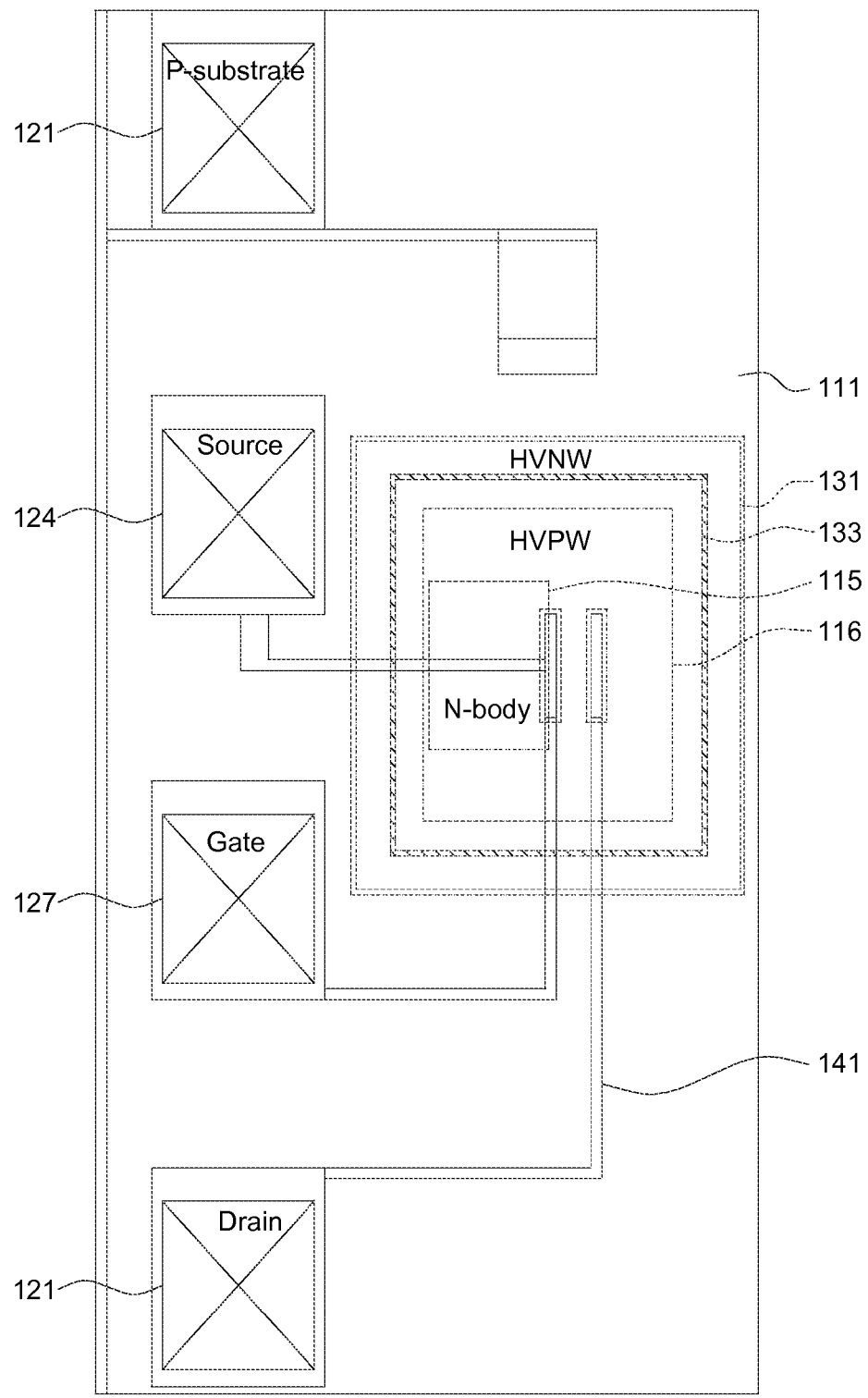
FIG. 1A is a top view of a high voltage metal-oxide-semiconductor (HVMOS) having a field device according to the first embodiment of the present disclosure.
Figure 1B:
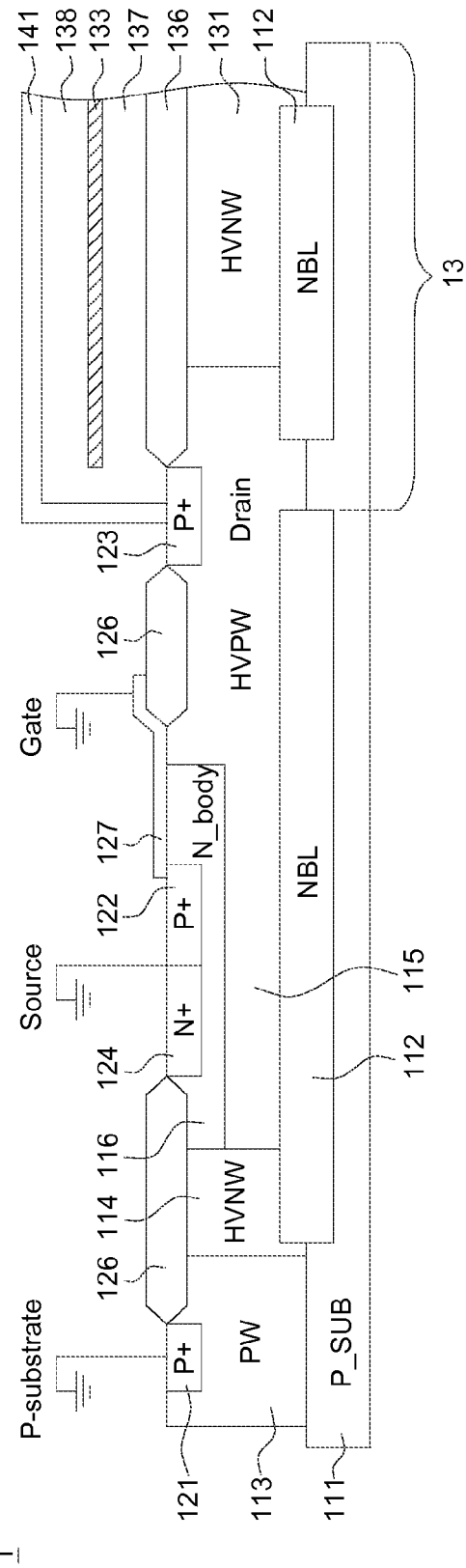
FIG. 1B is a cross-sectional view of the HVMOS and the field device corresponding to FIG. 1A according to the first embodiment of the present disclosure.

FIG. 1A is a top view of a high voltage metal-oxide-semiconductor (HVMOS) having a field device according to the first embodiment of the present disclosure. FIG. 1B is a cross-sectional view of the HVMOS and the field device corresponding to FIG. 1A according to the first embodiment of the present disclosure. Please refer to FIG. 1A and FIG. 1B. HVMOS 1 includes a P-substrate 111, the N+ Buried Layers (NBL) 112 formed within the P-substrate 111, P-wells (PW) 113, a high voltage N-well (HVNW) 114 and 131, a high voltage P-well (HVPW) 115, a N-body 116, P+ regions 121, 122 and 123, a N+ region 124 and insulations 126. The N+ Buried Layer (NBL) 112 provides isolation functionality. The HVPW 115 is positioned between the HVNW 114 and HVNW 131. The P+ region 121 is formed within the PW 113 and electrically connected to the P-substrate 111, and the N+ region 124 is formed within the N-body 116 as a source of the HVMOS. One insulation 126 (such as oxide) are formed above the PW 113, HVNW 114 and HVPW 115, and positioned between the P+ region 121 and the N+ region 124. Another insulation 126 is positioned between the P+ region 123 and the N-body 116. Also, a patterned conductive layer 127 as a gate is formed on the insulation 126 and electrically connected to the P+ region 122.

HVMOS 1 further includes a field device 13, comprising a first well such as the HVNW 131 (i.e. the first well having a second conductive type, formed in the substrate and extending down from a surface of the substrate having a first conductive type), a second well such as the HVPW 115 (i.e. the second well having the first conductive type, formed in the substrate and extending down from the surface of the substrate), a first doping region such as the P+ region 123 (i.e. the first doping region having the first conductive type), a conductive line 141 electrically connected to the first doping region (e.g. the P+ region 123) and across the first well (e.g. the HVNW 131) region, and a conductive body 133 positioned between the conductive line 141 and the first well (e.g. the HVNW 131), and the conductive body 133 positioned under the conductive line 141 correspondingly across the first well (e.g. the HVNW 131) region. The conductive body 133 is insulated from the conductive line 141. In the embodiment, the second well (e.g. the HVPW 115) adjacent to one side of the first well (e.g. the HVNW 131), and the substrate is at the other side of the first well. The first doping region (e.g. the P+ region 123) is formed in the second well, and the first doping region is spaced apart from the first well, wherein the doping concentration of the first doping region is larger than that of the second well.

Moreover, the field device 13 further comprises a first insulation layer 136 disposed on the first well (e.g. the HVNW 131) and extending to the first doping region (e.g. the P+ region 123), wherein the conductive body 133 is positioned above the first insulation layer 136. One example of the first insulation layer 136 is field oxide (FOX). In one embodiment, the field device 13 could comprise a first interlayer dielectric (ILD) 137 disposed between the first insulation layer 136 and the conductive body 133. In other embodiment, the space between the first well (e.g. the HVNW 131) and the conductive body 133 could be fully filled with the first insulation layer 136. In one embodiment, the field device 13 could also comprise a second insulation layer 138, such as a second interlayer dielectric, disposed between the conductive line 141 and the conductive body 133 for insulating the conductive body 133 from the conductive line 141. The first interlayer dielectric 137 and the second insulation layer 138 could be, but not limited to, oxides.

In one embodiment, the conductive line 141 is a top metal line, and the conductive body 133 could be made of polysilicon, metal (Al, Cu, Ag . . . ) or any conductive material. Fabrication of the conductive body 133 could be adopted in the current manufacturing process, and no extra cost and device area are required.

In one embodiment, the conductive body 133 could be a conductive ring surrounding the second well (e.g. the HVPW 115) and beneath the conductive line 141, as shown in FIG. 1A. However, the disclosure is not limited thereto. In practical applications, various shapes of the conductive body 133 could be adopted, such as circular, rectangular, elliptic shapes . . . etc, or a ring portion of those shapes, or other planes without interfering with other components, for achieving effect of voltage difference distribution and effectively improving the threshold voltage (Vth) of the field device. In the first embodiment, when the HVMOS 1 is under high voltage operation and a high voltage is applied to the conductive line 141, configuration of the field device 13 effectively avoids the field device turned on by applying no external voltage to the conductive body 133.

In the above description of the embodiment, P-type and N-type are exemplified as the first and second conductive types, respectively. Accordingly, the substrate in the field device 13 is the P-substrate 111, the first well is the HVNW 131, and the second well is the HVPW 115. Configuration of the field device 13 of the embodiment avoids channel reverse of the N region (i.e. HVNW 131) of the P-N-P structure to create an undesired current path. However, the disclosure is not limited thereto. The first and second conductive types could be N-type and P-type, which means the first well could be a HVPW while the second well could be a HVNW; thereby avoiding channel reverse of the P region of the N-P-N structure so as prevent the field device turned on.

Second Embodiment

Figure 2A:
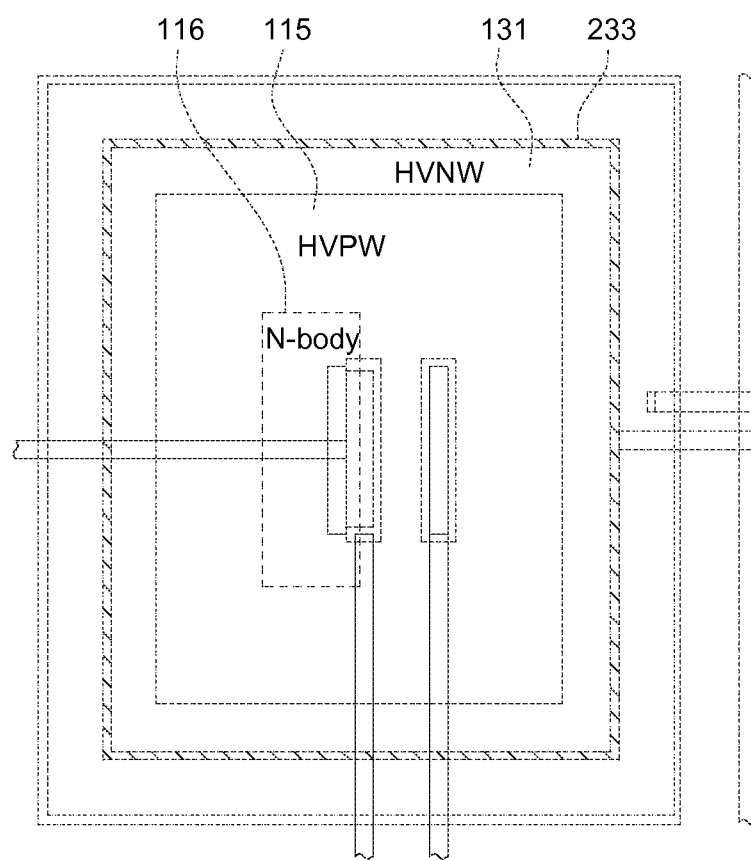
FIG. 2A is a top view of a high voltage metal-oxide-semiconductor (HVMOS) having a field device according to the second embodiment of the present disclosure.
Figure 2B:
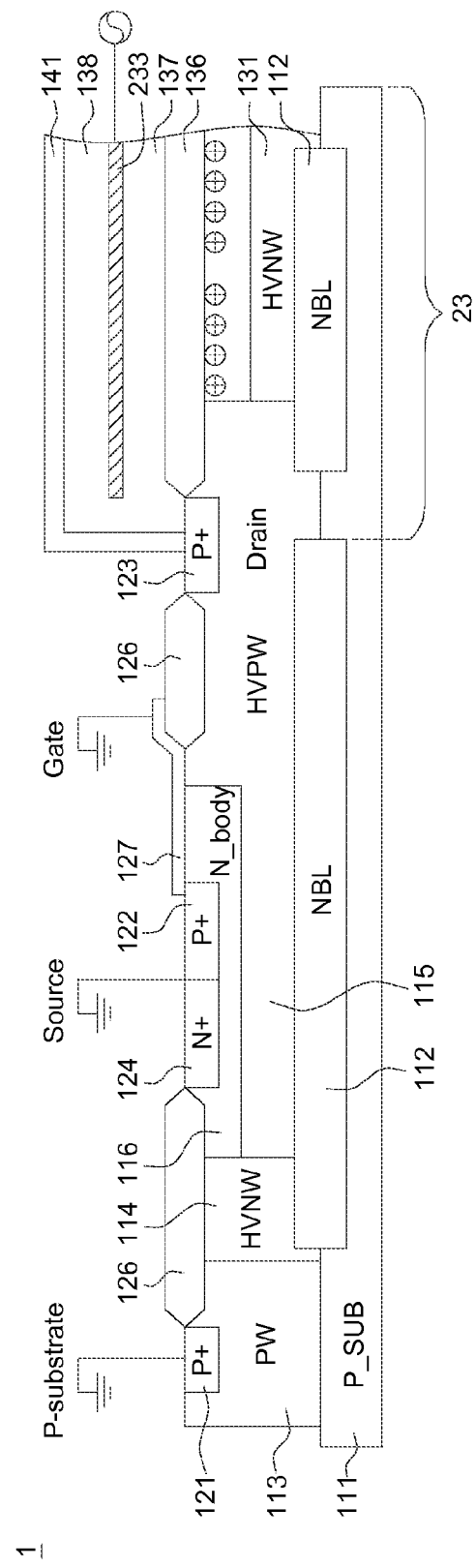
FIG. 2B is a cross-sectional view of the HVMOS and the field device corresponding to FIG. 2A according to the second embodiment of the present disclosure.

FIG. 2A is a top view of a high voltage metal-oxide-semiconductor (HVMOS) having a field device according to the second embodiment of the present disclosure. FIG. 2B is a cross-sectional view of the HVMOS and the field device corresponding to FIG. 2A according to the second embodiment of the present disclosure. The components of the following embodiments (such as in FIG. 2A and FIG. 2B) identical or similar to the components of FIG. 1A and FIG. 1B of the first embodiment retain the same or similar reference numerals, and the details are not redundantly described.

In the field device 23 of the second embodiment, the conductive body 233 is disposed under the conductive line 141, and further electrically connected to an external voltage source for applying a fixed voltage bias to the conductive body 233. Fabrication of the conductive body 233 could also be adopted in the current manufacturing process, and no extra cost and device area are required.

In the second embodiment, the conductive body 233 could be floating metal or conductive ring with a fixed voltage bias. When the HV semiconductor device is under high voltage operation, measurement results have indicated that the conductive body 233 pattern floating or fixed voltage biases (e.g. Metal 1=0V/−10V) can avoid the field device 23 turned on. In one example, when −150V is applied to the conductive line 141, the conductive body 233 could be applied with 0V, −10V, −20V, −30V, −40V, −70V, −80V . . . or other fixed voltage bias value. It is noted that the fixed voltage bias value is not limited to those numbers provided herein and could be adjusted and selected according to the requirements of practical applications.

Third Embodiment

Figure 3:
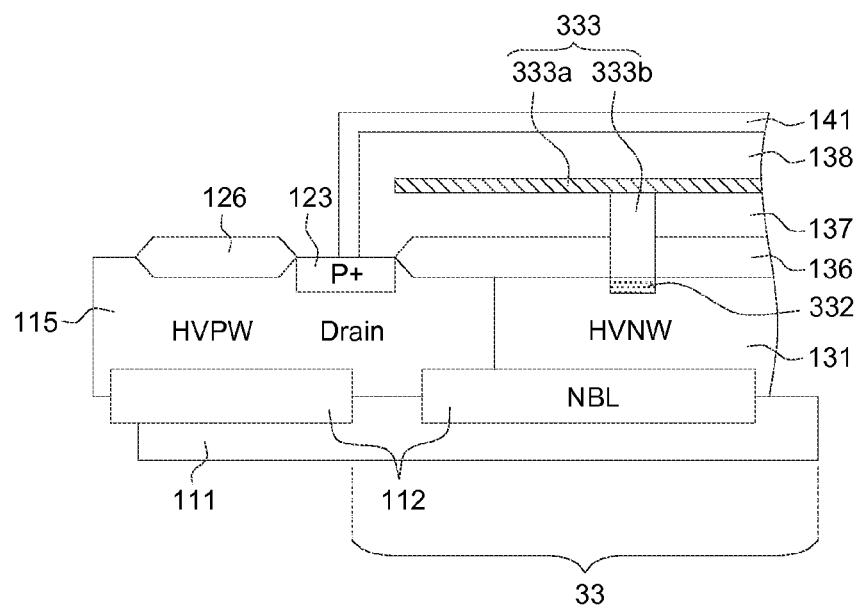
FIG. 3 is a cross-sectional view of a field device according to the third embodiment of the present disclosure.

FIG. 3 is a cross-sectional view of a field device according to the third embodiment of the present disclosure. The components of FIG. 3 identical or similar to the components of FIG. 1A-FIG. 2B of the first and second embodiments retain the same or similar reference numerals, and the details are not redundantly described.

In the third embodiment, the conductive body 333 of the field device 33 is disposed between the first well (e.g. HVNW 131) and the conductive line 141, and the field device 33 further comprises a second doping region 332 formed in the first well (e.g. HVNW 131) for interrupting continuity of the first well. The second doping region 332 and the first well have the same dosage type (e.g. the second conductive type), and the doping concentration of the second doping region 332 is larger than the doping concentration of the first well, and the second doping region 332 is electrically connected to the conductive body 333. In one embodiment, the second doping region 332 is a heavily doped region. The second doping region 332 with high doping concentration keeps isolation of the first well (e.g. HVNW 131) workable.

As shown in FIG. 3, the conductive body 333 comprises a body portion 333a and a pillar portion 333b connected to the body portion 333a, and the pillar portion 333b extends downwardly and passes through the first insulation layer 136 to electrically connect the second doping region 332. Fabrication of the conductive body 333 could also be adopted in the current manufacturing process, and no extra cost and device area are required.

In the third embodiment, when the HVMOS is under high voltage operation, configuration of the field device 33 effectively avoids the field device turned on by applying no external voltage to the conductive body 333.

Figure 4:
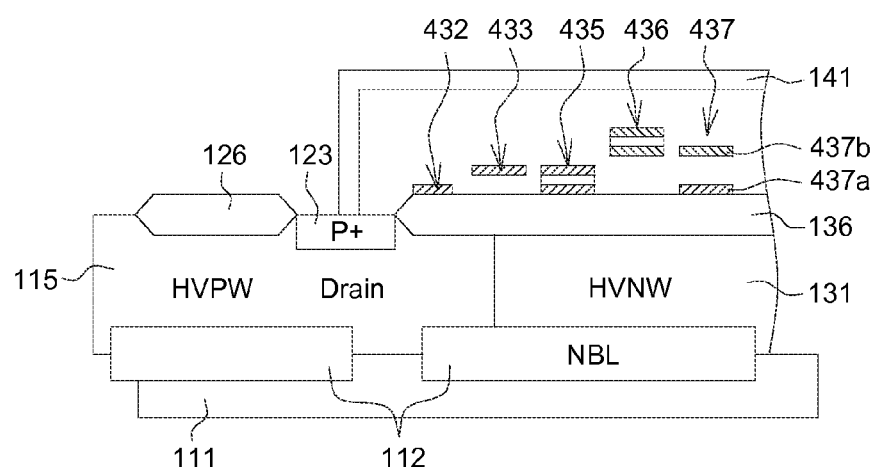
FIG. 4 simply illustrates five different types of the conductive bodies according to the embodiments of the present disclosure.

Although a single layer of the conductive body is taken for illustration in the forgoing description, the disclosure is not limited thereto, and a multilayer could be alternatively adopted as the conductive body in other embodiments, according to actual needs of practical application. FIG. 4 simply illustrates five different types of the conductive bodies according to the embodiments of the present disclosure. As shown in FIG. 4, a single polysilicon layer 432 or 433 could be used as the conductive body under the conductive line 141, wherein the polysilicon layer 432 is directly formed on the first insulation layer 136, while the polysilicon layer 433 is insulated form the conductive line 141 by ILD (such as oxide), and apart and insulated from the first insulation layer 136 by same or other ILD. The single layer comprising polysilicon, metal or other conductive materials beneath the conductive line is able to avoid channel reverse of the field device under high voltage operation. Alternatively, the conductive body could be a multilayer, such as a PIP multilayer 435 including two polysilicon layers with an isolation sandwiched therebetween, or a MIM multilayer 436 including two metal layers with an isolation sandwiched therebetween, or a multilayer 437 including one metal layer 437b and one polysilicon layer 437a with an isolation sandwiched therebetween. As shown in FIG. 4, the MIM multilayer 436 could be spaced apart from the first insulation layer 136 by ILD; and the polysilicon layer 437a of the multilayer 437 is directly formed on the first insulation layer 136 and paced apart from the metal layer 437b by ILD. The disclosure is not limited to those types of conductive bodies, and the conductive bodies could be varied by modifying the configurations of the embodiments or according to the actual needs of practical applications.

Applications of the embodiments include a variety of devices, such as PN junction, bipolar junction transistor (BJT), metal-oxide-semiconductor field effect transistor (MOSFET), extended drain MOS (ED N/PMOS), lateral diffused MOS (LD N/PMOS), double diffused drain MOS (DDD N/PMOS), lightly-doped drain MOS (LDD N/PMOS), COOLMOS™, vertical double-diffused MOS (VDMOS), insulated gate bipolar transistor (IGBT) . . . etc. Any devices that have parasitic field turned on issue can adopt the conductive body under the conductive line (such as top metal line), with or without applying a fixed voltage bias to the conductive body, to avoid field device turned on. Alternatively, electrically connecting the conductive body to a high dosage region (e.g. the second doping region 332) in the first well (e.g. HVNW 131) and both have same dosage type can also avoid field device turned on.

Many modifications and other embodiments of the disclosure set forth herein will come to mind to one skilled in the art to which these disclosure pertain having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of operating high voltage semiconductor device, comprising:
   providing the high voltage semiconductor device with a field device, and the field device comprising a first well and a second well both extending down from a surface of the substrate and formed in the substrate, and the second well adjacent to one side of the first well while the substrate at the other side of the first well; a first doping region formed in the second well and spaced apart from the first well; a conductive line electrically connected to the first doping region and across the first well region; and a conductive body positioned between the conductive line and the first well, and the conductive body insulatively under the conductive line correspondingly across the first well region, wherein the first well having a second conductive type while each of the substrate, the second well and the first doping region having a first conductive type; a first insulation layer disposed on the first well and extending to the first doping region, wherein the conductive body is positioned above the first insulation layer; and either no external voltage or a fixed voltage bias is applied to the conductive body when the HV semiconductor device is operated at a high voltage.

2. The method according to claim 1, wherein the conductive body is further electrically connected to a voltage source, the fixed voltage bias is applied to the conductive body when the HV semiconductor device is operated.

3. The method according to claim 1, wherein the field device provided further comprises a second doping region having the second conductive type and formed in the first well for interrupting continuity of the first well, and doping concentration of the second doping region is larger than doping concentration of the first well, and the second doping region is electrically connected to the conductive body.

4. The method according to claim 1, wherein the conductive body of the field device comprises a pillar portion extending downwardly and passing through the first insulation layer to electrically connect the second doping region.

5. The method according to claim 1, wherein the field device provided further comprises a first interlayer dielectric disposed between the first insulation layer and the conductive body.

6. The method according to claim 1, wherein the field device provided further comprises a second insulation layer disposed between the conductive line and the conductive body for insulating the conductive body from the conductive line.

7. The method according to claim 1, wherein the conductive body of the field device is a single layer comprising polysilicon or metal.

8. The method according to claim 1, wherein the conductive body of the field device is a multilayer comprising two polysilicon layers with an isolation sandwiched therebetween, or two metal layers with the isolation sandwiched therebetween, or one metal layer and one polysilicon layer with the isolation sandwiched therebetween.

* * * * *